United States Patent [19]
Lei et al.

[11] Patent Number: 5,913,985
[45] Date of Patent: Jun. 22, 1999

[54] FIXTURE AND METHOD FOR SECURING ELECTRONIC MODULES DURING WET PROCESSING

[75] Inventors: Chon Cheong Lei, Poughkeepsie; Lannie R. Bolde, New Paltz; Donn Allan Lord, Hyde Park, all of N.Y.

[73] Assignee: International Business Machines Corporation, Armonk, N.Y.

[21] Appl. No.: 08/907,790

[22] Filed: Aug. 8, 1997

[51] Int. Cl.⁶ .................................. B08B 3/04; B08B 3/10
[52] U.S. Cl. ............................ 134/34; 134/183; 134/902
[58] Field of Search ..................................... 134/182, 183, 134/902, 2, 1, 1.3, 34, 26, 15; 156/345; 216/83, 92

[56] References Cited

U.S. PATENT DOCUMENTS

| | | | |
|---|---|---|---|
| 4,767,984 | 8/1988 | Bakker | 324/754 |
| 4,810,616 | 3/1989 | Grabbe et al. | 430/269 |
| 5,106,451 | 4/1992 | Kan et al. | 156/583.3 |
| 5,275,690 | 1/1994 | Garwood, Jr. | 134/902 X |
| 5,332,463 | 7/1994 | Eberlein et al. | 156/556 |
| 5,465,470 | 11/1995 | Vongfuangfoo et al. | 29/559 |

*Primary Examiner*—Jill Warden
*Assistant Examiner*—Alexander Markoff
*Attorney, Agent, or Firm*—DeLio & Peterson; Peter W. Peterson; Aziz M. Ahsan

[57] ABSTRACT

A fixture for securing a circuit chip substrate having on one side solder connections during wet processing using a pulse jet delivery cleaning system for removing solder flux residue on the solder connections. The fixture comprises a frame of sufficient size to at least partially surround and contact the substrate on a first side and a lid cooperating with the frame to at least partially cover the substrate on a second side containing the solder connections. A resilient polymeric separator is disposed on the lid and faces the substrate for contacting the substrate second side containing the solder connections. There are also openings in the frame for permitting circulation of a cleaner to contact the second side of the substrate.

20 Claims, 3 Drawing Sheets

FIXTURE AND METHOD FOR SECURING ELECTRONIC MODULES DURING WET PROCESSING

BACKGROUND OF THE INVENTION

1. Field of the Invention

This invention relates generally to manufacturing of electronic circuits in which solder connections are utilized to make connections to a circuit chip substrate and is directed in particular to an apparatus and method for securing the chip substrate during wet processing such as cleaning.

2. Description of Related Art

Forming an electronic package whereby an electrical component such as a multilayer ceramic package or circuit chip substrate is electrically connected to a substrate such as a card, a board, another connector and any other electronic part is well known in the art. Surface mount technology (SMT) has gained acceptance as a preferred means as joining electronic devices together, particularly in high end computers. As circuit densities increase there is an increased demand for more I/O and the interconnections which are solder bonded must be smaller and more closely spaced.

Numerous solder structures have been proposed for surface mounting. Typically the surface mount process is performed by screening solder paste on conductive metallic pads exposed on a surface of a first electronic structure or substrate. A stencil printing operation is used to align a contact mask to the pads. Other known surface mount technology uses solder balls rather than solder paste to provide the solder connecting structures. This technology is known as C-4 and, by using such solder balls, a more exact and somewhat greater quantity of solder can be applied than can be applied through screening. Another type of solder interconnection is cast solder column which is mainly used to connect a multilayer ceramic package to a board. The method of utilizing solder balls is also know as ball grid array or BGA, while the method of utilizing solder columns is generally referred to as column grid array or CGA.

When solder columns or balls are joined to ceramic substrates, a solder flux such as a rosin is typically used to remove oxides from both substrate and column or ball surfaces. This prevents or reduces oxidation from the joining surfaces when they are subjected to elevated temperatures for soldering, thereby serving to maintain the solderability of the substrate and solder columns or balls. If there is any flux residue left on the substrate surface, corrosion may result.

It has been a problem in the prior art to remove residual flux, which problem has typically been solved by utilizing solvents. It has been found that a major problem associated with the above processes is in supporting the substrate vertically in a manner that will prevent damage to the solder balls or columns during the cleaning cycle. Such cleaning cycles and other processing which utilizes liquids is generally referred to as wet processing.

Conventional fixturing utilized in the past has typically supported substrates by utilizing open space between the edge of the substrate and the edge of the balls, columns or pins. This has allowed the parts to be held by the substrate body, thereby preventing the balls, columns or pins from making contact with the fixture body. However an increasing number of electronic structures have reduced the distance from the substrate edge to the first row of columns or balls. This is typically been 0.025 inches (0.63 mm)for CGA product and 0.015 inches (0.38 mm) for BGA product. This reduction in space along with typical variations in substrate tolerance has made it difficult to utilize conventional fixturing to support the substrates during wet processing.

Bearing in mind the problems and deficiencies of the prior art, it is therefore an object of the present invention to provide an improved apparatus and method of supporting substrates utilizing solder connections during wet processing.

It is another object of the present invention to provide an apparatus and method for supporting substrates having solder connections which does not utilize or support the substrate in the space between the edge of the substrate and the first row of columns or balls.

It is yet another object of the present invention to provide an apparatus and method of securing substrates having solder connections which may accommodate different sizes of substrates.

Still other objects and advantages of the invention will in part be obvious and will in part be apparent from the specification.

SUMMARY OF THE INVENTION

The above and other objects, which will be apparent to those skilled in the art, are achieved in the present invention which relates to a fixture for securing an electronic module or circuit chip substrate having on one side solder connections during wet processing. The fixture comprises a frame of sufficient size at least partially to surround and contact the substrate on a first side and a lid cooperating with the frame at least partially to cover the substrate on a second side containing solder connections opposite the first side. A separator, preferably of a resilient material, is disposed on the lid and faces the substrate for contacting the substrate second side containing the solder connections. There is also provided means for securing the lid to the frame and means for permitting circulation of a liquid to contact the second side of the substrate. More preferably, the separator is made of a flexible polymeric material. The means for permitting circulation of a liquid may comprise openings in the lid and, optionally, openings between the lid and frame. The frame may contain depressions on an inner surface corresponding to the configuration of the substrate.

In an alternate embodiment, the frame includes a depression for receiving a substrate of a first size and an insert disposed in the depression of the frame for receiving a substrate of a second size smaller than the first size.

In another aspect, the present invention provides a method of securing a circuit chip substrate having on one side solder connections during wet processing. The method includes initially providing a frame of sufficient size at least partially to surround and contact the substrate on a first side; a lid cooperating with the frame at least partially to cover the substrate on a second side opposite the first side; a resilient separator disposed on the lid and facing the substrate for contacting the substrate second side; and means for permitting circulation of a liquid to contact the second side of the substrate. The method then includes placing the substrate in the fixture such that the resilient separator contacts the second side and wet processing the substrate while in the fixture by circulating the liquid through the circulation means. The wet processing preferably comprises contacting the substrate with a cleaner, for example, with a jet pulse delivery system. The substrate typically has solder connections on the second side having solder flux thereon and the resilient separator contacts the substrate solder connections, such that the wet processing comprises contacting the substrate solder connections with a cleaner, preferably an organic cleaner, for removing the solder flux residue.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1:
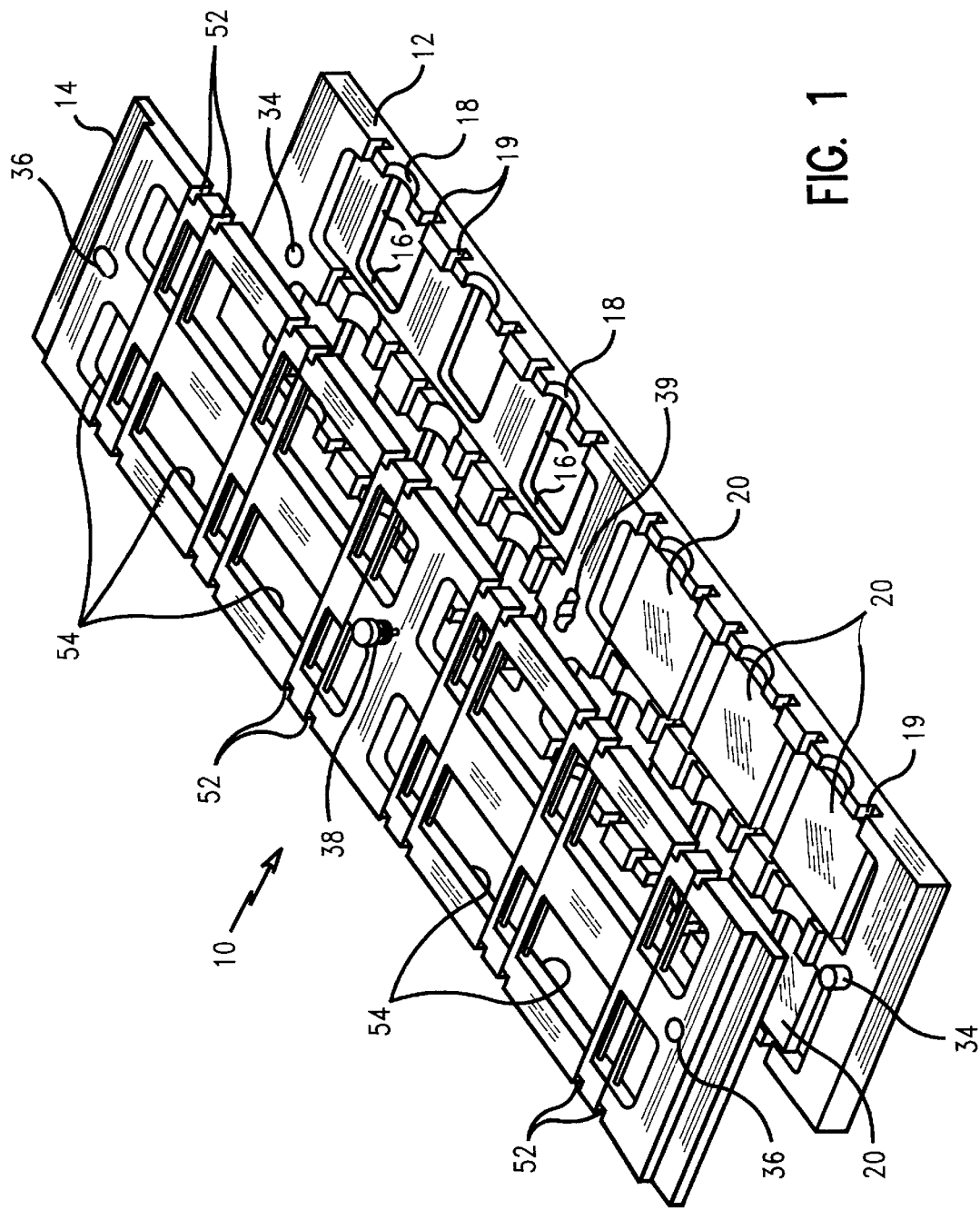
FIG. 1 is an exploded, perspective view of the preferred fixture employed to secure a plurality of substrates for wet processing in accordance with the present invention.

In describing the preferred embodiment of the present invention, reference will be made herein to FIGS. 1–3 of the drawings in which like numerals refer to like features of the invention. Features of the invention are not necessarily shown to scale in the drawings.

For attachment to ceramic modules or another electronic device, an important technology particularly for high end computers, flip-chip or controlled collapse chip connection (C-4), may be used in which arrays of solder balls are fabricated on the I/O pads of the chips and used to connect the chip to the ceramic module. To make the electrical connection the solder balls are positioned with flux on the corresponding pads on the ceramic module and passed through furnace to reflow the solder and allow it to wet the pads on both the chip and the ceramic. The use of solder ball connections has been applied to the mounting of integrated circuit chips using the C-4 technology since the method and structure were first described and patented in U.S. Pat. Nos. 3,401,126 and 3,429,042 of Miller, which patents are assigned to the present assignee, and which disclosures are hereby incorporated by reference. More recently, larger solder balls have been used in surface mount technology to attach single and multichip packages to circuit cards and so called BGA technology.

Other methods utilized to form solder mounts (e.g., columns, etc.) are well known and have been disclosed in other prior patents, for example U.S. Pat. No. 5,244,143 to Ference et al. (assigned to the assignee of the instant application), the disclosure of which is hereby incorporated by reference. The patent discloses an apparatus and method for injection molding solder mounts on to transfer backing plates or electronic devices. In general, the apparatus has a reservoir for molten solder which is disposed over a cavity in an injection plate. The injection plate is disposed over a mold having an array of cavities therein into which solder is injection molded. The mold is typically disposed over a work piece such as a multilayer ceramic substrate and the cavities in the mold are aligned with electrical contact with locations on the substrate. The workpiece is heated and the molten solder is forced under gas pressure into the cavity in the injection plate disposed above the array of cavities in the mold and the molten solder is forced into the cavities. In one embodiment, the injection plate is advanced to slide over the stationary mold to wipe away the excess solder above the mold at a plurality of wiping apertures in the injection plate. The injection plate is then further advanced to a location having a non solder wettable surface at which location the injection plate is removed. The mold is then removed to leave solder mounts disposed on the workpiece.

Solders typically used are low melting alloys used in numerous joining applications and may vary widely as is well know in the art. The solders are typically a lead-tin alloy such as 40Pb/60Sn alloy and may contain up to 97% Pb or above. A typical solder used in commercial C-4 applications contains by weight 97% lead and 3% tin.

Regardless of the form of the solder connection or the method of making the solder connection, there are typically three (3) stages at which cleaning of the solder surface may be essential. First, during the deployment of the solder prior to making the connection, processing of solder may leave undesirable residue. For example, in evaporating or plating of solder balls for C-4 connections, photoresist plating bath residues may be left which will interfere with proper solder wetting of the pads. Second, to maintain the alignment of the solder to the pads on the substrate or card and to allow good wetting of the solder on the pads, flux is most often used and will need to be removed to avoid leaving corrosive contaminants on the packing assembly. Finally, rework of assemblies requires special handling which may require a cleaning step that assures the reliability of the package. For example, removable of a reworkable epoxy underfill, as described in U.S. Pat. No. 5,512,613 (assigned to the assignee of the present application) requires a cleaning process that does not attack the C-4 solder joints. All three of these examples, and others, generally require wet processing of the solder connections on the chip.

Fluxes may also vary widely and are typically rosin based. A flux may be generally defined as a material that chemically attacks surface oxides so that molten solder can wet the surface to be soldered. During the soldering process, the solder is melted and reflowed to form the connection and residual flux must be removed to prevent corrosion.

Thus after chip attachment, the solder must be cleaned to remove residual flux, flux products and other contaminants. This is typically performed as exemplified by a C-4 manufacturing process by immersion in a bath containing organic solvents such as xylene. In order to secure the substrates through various wet processes, it has been found that securing in a vertical position is desirable. The present invention helps to prevent damage to solder connections while supporting the product through such processes.

Unfortunately, however removal of the flux and flux products and cleaning of the solder is also a difficult task because the cleaning process may itself be corrosive to the solder and/or electronic component. Additionally, dissolution of the solder can occur, resulting in smaller solder bonds and causing disposable problems since the solder generally made of lead-tin alloys and their solution impose an environmental threat if discharged.

Figure 2:
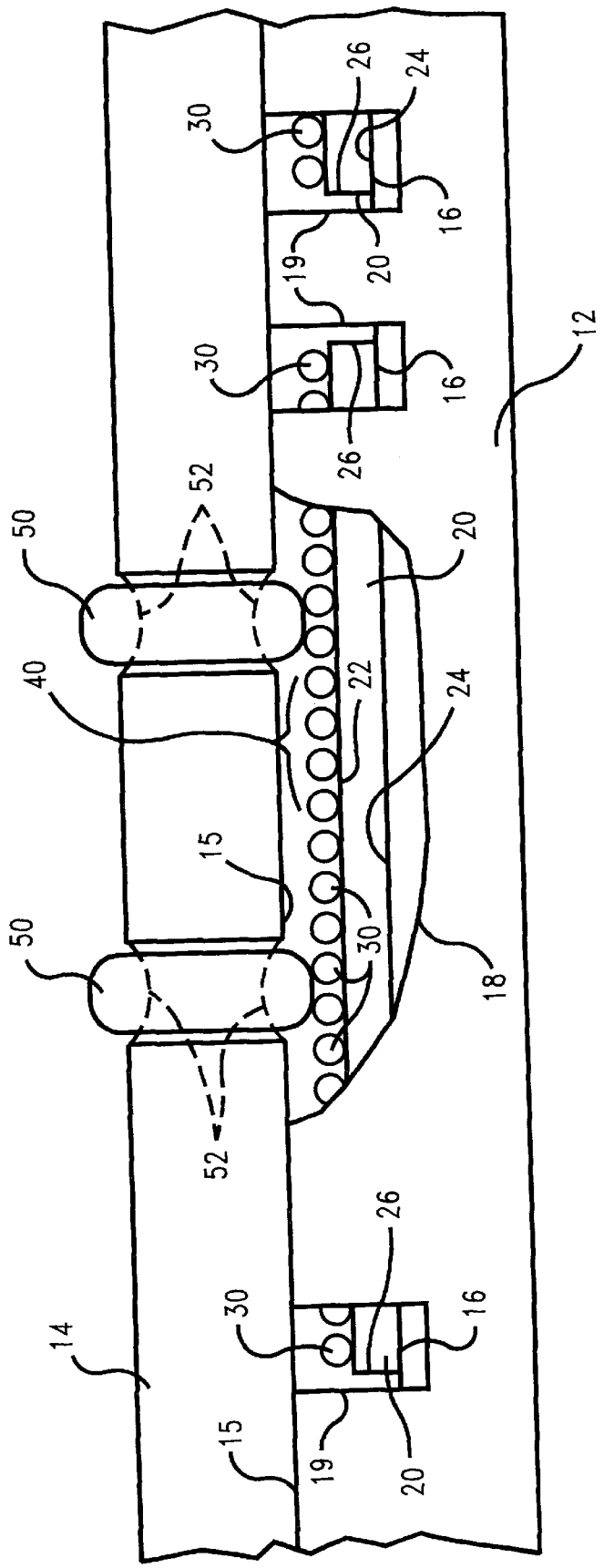
FIG. 2 is an elevational view, partially cut away, of a substrate having solder connections secured in the fixture of FIG. 1

In FIGS. 1 and 2 there is shown a preferred embodiment of the fixture utilized in connection with the present invention. The fixture 10 includes a lower base or frame 12 which receives electronic modules or chip substrates 20 within supporting surfaces or cavities 16 molded or machined into the base to conform to the configuration of substrate 20. Mating with fixture base 12 there is provided fixture lid 14 which is of corresponding size to fit over base 12 and be secured in position by means of upwardly projecting base pins 34 which fit into corresponding lid openings 36. Lid 14 contains a plurality of openings 54 which substantially correspond in size and placement to substrates 20 mounted in base 12 in order to facilitate circulation of a cleaning or other liquid as such that the liquid contacts the surface of the chip substrate. Also provided in fixture base 12 are openings 18 in the side of the base to provide additional means for circulating the liquid between the lid and the base for contact with the substrate. A plurality of openings 19 in the sidewalls of the base frame correspond approximately to the edges 26 (FIG. 2) of substrate modules 20. Preferably, the base and lid are fabricated from aluminum or some other material which provides sufficient strength to secure the parts while being relatively inert to the cleaning liquids used. As shown in FIG. 1, the modules are arranged in cavities in base 12 in a rectangular array, here shown as a 2×6 array. Other arrangements may be contemplated within the scope of the present invention.

As shown more clearly in FIG. 2, the lid 14 lower surface 15 is spaced from base supporting surface 16 to receive substrate or module 20, the top surface 22 of which contains a plurality of BGA, CGA or other solder connections, here shown as solder balls 30. The lower surface 24 of substrate 20 rests directly on base supporting surface 16 near the substrate edges 26. As shown in the preferred embodiment, the lower surface 24 of each of the substrates away from edges 26 does not make contact with the base and is aligned with the base opening between the supporting surfaces 16. The side of the module 20 opposite the BGA or CGA solder connections may have C-4 devices and discretes (resistors and capacitors) attached to it, and may have a protective aluminum cap over it while secured in the fixture base cavity. In the case of a capless module, the free space in the base 12 between supporting surfaces 16 eliminates damage to such C-4 devices and discretes.

To secure the substrates 20 against the fixture base, there are provided a plurality of compliant or resilient separators 50 disposed on the lid and facing the substrate for contacting the substrate upper side on which are deposited the solder connections. Residual flux is shown as 40 on the connections. As shown in FIG. 2, these resilient separators are O-rings which are preferably made of a polymeric material, such as Viton brand fluoroelastomers available from DuPont Dow Elastomers LLC, which is resistant to the fluxes and cleaning solutions utilized in wet processing. These resilient separator O-rings extend completely around the lid and make direct contact with the solder connections 30 and act as a cushion against the BGA and CGA while holding the substrate securely in place. This allows the parts to be held vertically through aggressive fluid agitation cycles contacting the substrate on solder connections, without causing damage to the soft solder arrays. Lid 14 also contains grooves 52 into which are fitted the O-rings 50 to hold them securely in place.

The lid 14 cooperates with the frame 12 at least partially to cover the substrate on the side containing the solder columns. The frame 12 is of sufficient size to at least partially surround and contact the substrate on the lower side away from the solder connections. A fastening device such as a lock pin 38 in the center lid 14 may be fitted into opening 39 in the base 12 in order to secure the lid to the frame (FIG. 1). Other fastening devices may be employed in place of the lock pin.

Figure 3:
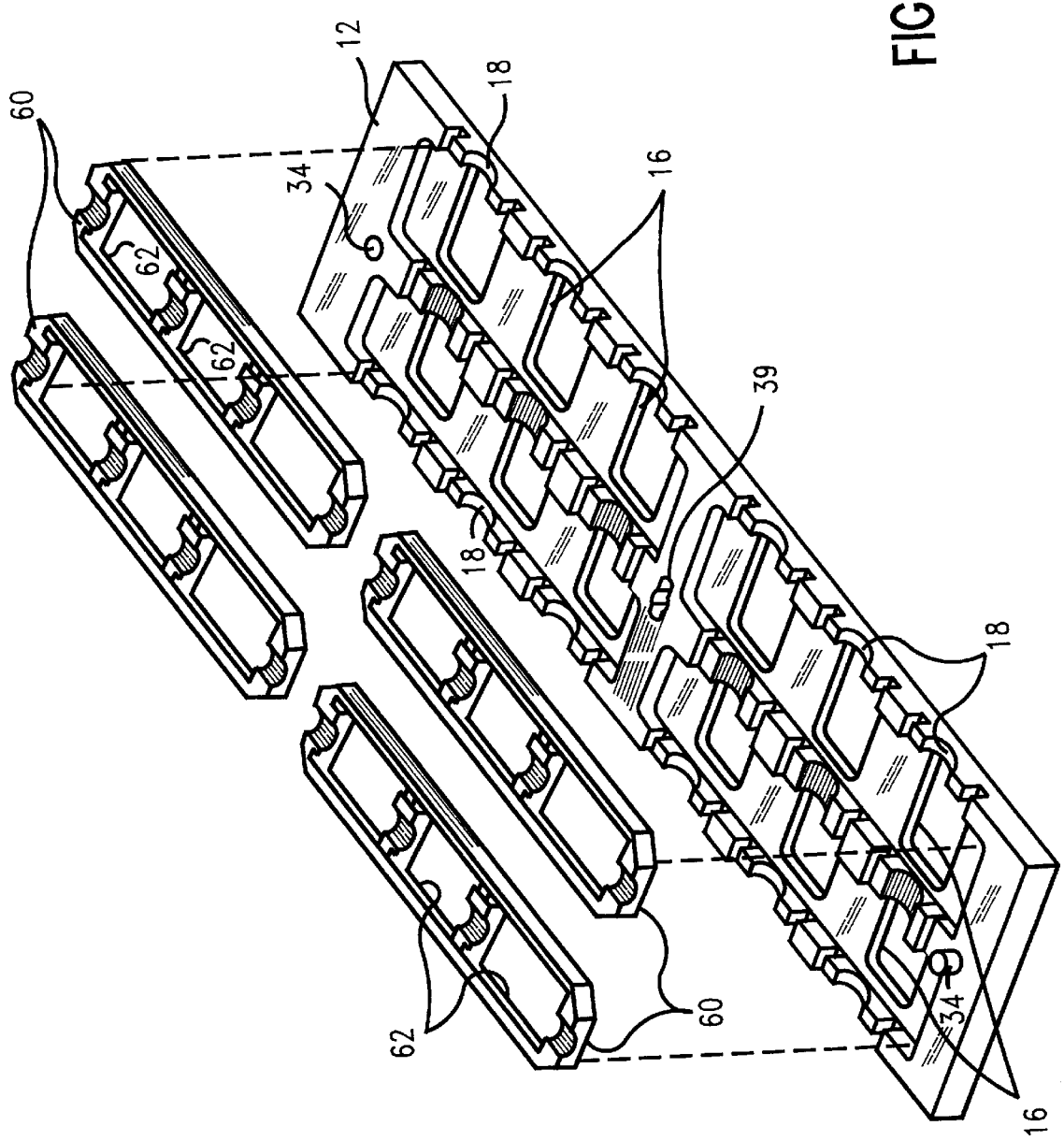
FIG. 3 is an exploded, perspective view of a modification of the fixture of FIG. 1 which may hold different size substrates for wet processing in accordance with the present invention.

In a modification depicted in FIG. 3, there may be provided one or more base inserts 60 which contain supporting surfaces or cavities 62 of a different size than supporting surfaces 16 in frame 12. These inserts are placed into the pre-existing cavities in base 12 and may then accommodate substrate modules of different sizes and configurations than those machined into frame or base 12 so that the fixture of the present invention may be employed to secure more than one size substrate module.

In operation, the substrates are placed in a fixture such that the resilient separators 50 contact the side of the substrate containing the solder connections, for example, BGA or CGA connections. The fixture is then placed vertically in a cleaning or other wet processing tank such that the plane of the fixture is vertical and the cleaning liquid is then circulated through the openings in the lid and/or the lid and the fixture to facilitate contact of the liquid and the solder flux on solder connections in order to remove the residual solder flux. A pulsating jet delivery system of the cleaner may be utilized with the fixture of the present invention which permits the cleaner spray to pass behind the compliant separators.

Accordingly, the present invention then provides an improved fixture to facilitate the cleaning of solder residue and other wet processing of chip modules. The fixture does not require contact with the substrate between the substrate edge and the first row of solder balls, so that there are no limitations on the size of this distance between the edge and the first row of solder balls. Finally, the use of the resilient separators evenly distributes stress to the substrate and prevents deformation and damage to the solder balls and other solder connections while permitting the flux to be removed during the cleaning cycles without damage to the soft solder.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A fixture for securing a circuit chip substrate having on one side solder connections during wet processing comprising:
   a frame of sufficient size at least partially to surround and contact said substrate on a first side;
   a lid cooperating with said frame at least partially to cover said substrate on a second side opposite said first side;
   a separator disposed on said lid and facing said substrate for contacting said substrate second side;
   means for securing said lid to said frame; and
   means for permitting circulation of a liquid to contact said second side of said substrate.

2. The fixture of claim 1 wherein said separator is made of a flexible polymeric material.

3. The fixture of claim 1 wherein said means for permitting circulation of a liquid comprises openings in said lid.

4. The fixture of claim 1 wherein said frame contains depressions on an inner surface corresponding to the configuration of said substrate.

5. The fixture of claim 1 wherein said means for securing said lid to said frame comprises a fastening device.

6. The fixture of claim 1 wherein said frame includes a depression for receiving a substrate of a first size and an insert disposed in the depression of said frame for receiving a substrate of a second size smaller than said first size.

7. A fixture assembly for securing a circuit chip substrate having on one side solder connections during wet processing comprising:

a circuit chip substrate having solder connections on one side and solder flux on said solder connections;

a frame of sufficient size at least partially to surround and contact said substrate on the side opposite said solder connections;

a lid cooperating with said frame at least partially to cover said substrate on the side containing said solder connections;

a resilient separator disposed on said lid and facing said substrate for contacting said solder connections;

means for securing said lid to said frame; and means for permitting circulation of a liquid to contact said solder connections on said substrate and remove said solder flux.

8. The fixture of claim 7 wherein said frame contains depressions on an inner surface corresponding to the configuration of said substrate.

9. The fixture of claim 7 wherein said means for securing said lid to said frame comprises a fastening device.

10. The fixture of claim 7 wherein said frame includes a depression for receiving a substrate of a first size and an insert disposed in the depression of said frame for receiving a substrate of a second size smaller than said first size.

11. A fixture assembly for securing a circuit chip substrate having on one side solder connections during wet processing comprising:

a circuit chip substrate having solder connections on one side and solder flux on said solder connections;

a frame of sufficient size at least partially to surround and contact said substrate on the side opposite said solder connections, said frame including a depression for receiving said substrate;

a lid cooperating with said frame at least partially to cover said substrate on the side containing said solder connections;

a separator disposed on said lid and facing said substrate for contacting said solder connections;

a fastener securing said lid to said frame; and openings in said fixture permitting circulation of a liquid to contact said solder connections on said substrate and remove said solder flux.

12. The fixture of claim 11 wherein said separator is made of a flexible polymeric material.

13. The fixture of claim 11 wherein said means for permitting circulation of a liquid comprises openings in said lid.

14. The fixture of claim 11 wherein said frame includes an insert disposed in the depression of said frame for receiving said substrate.

15. A method of securing a circuit chip substrate having on one side solder connections during wet processing comprising:

providing a frame of sufficient size at least partially to surround and contact said substrate on a first side; a lid cooperating with said frame at least partially to cover said substrate on a second side opposite said first side; a resilient separator disposed on said lid and facing said substrate for contacting said substrate second side; and means for permitting circulation of a liquid to contact said second side of said substrate;

placing said substrate in said fixture such that said resilient separator contacts said second side; securing the lid to the frame; and wet processing said substrate while in said fixture by circulating said liquid through the circulation means.

16. The method of claim 15 wherein said wet processing comprises contacting said substrate with a cleaner.

17. The method of claim 15 wherein said substrate includes solder connections on said second side, wherein said resilient separator contacts the substrate solder connections and wherein wet processing comprises contacting the substrate solder connections with a cleaner.

18. The method of claim 15 wherein said substrate includes solder connections on said second side having solder flux thereon, wherein said resilient separator contacts the substrate solder connections and wherein wet processing comprises contacting the substrate solder connections with a cleaner for removing the solder flux.

19. The method of claim 15 wherein said wet processing comprises contacting the substrate solder connections with a pulsating jet of cleaner for the solder connections.

20. The method of claim 19 wherein said cleaner comprises an organic cleaner for solder flux residue.

* * * * *